United States Patent
Lee et al.

(10) Patent No.: US 9,613,702 B1
(45) Date of Patent: Apr. 4, 2017

(54) NAND FLASH MEMORY DEVICE WITH OBLIQUE ARCHITECTURE AND MEMORY CELL ARRAY

(71) Applicant: MACRONIX International Co., Ltd., Hsinchu (TW)

(72) Inventors: Ya-Jui Lee, Hsinchu (TW); Kuan-Fu Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/986,124

(22) Filed: Dec. 31, 2015

(51) Int. Cl.
  G11C 11/34 (2006.01)
  G11C 16/08 (2006.01)
  G11C 11/418 (2006.01)
  G11C 16/24 (2006.01)
  G11C 16/04 (2006.01)

(52) U.S. Cl.
  CPC ............ G11C 16/08 (2013.01); G11C 11/418 (2013.01); G11C 16/0408 (2013.01); G11C 16/24 (2013.01)

(58) Field of Classification Search
  CPC ....... G11C 16/08; G11C 11/418; G11C 16/24; G11C 16/0408
  See application file for complete search history.

(56) References Cited

U.S. PATENT DOCUMENTS

| 6,646,914 | B1* | 11/2003 | Haddad | G11C 16/0416 365/185.05 |
| 6,768,683 | B1* | 7/2004 | Fastow | G11C 5/063 365/185.05 |
| 7,746,680 | B2 | 6/2010 | Scheuerlein et al. | |
| 2005/0237799 | A1* | 10/2005 | Fukuoka | G11C 16/0416 365/185.3 |
| 2010/0315856 | A1* | 12/2010 | Alami | G11C 17/12 365/104 |
| 2011/0156116 | A1* | 6/2011 | Eppich | H01L 29/0665 257/27 |

FOREIGN PATENT DOCUMENTS

TW  200931496  7/2009

OTHER PUBLICATIONS

"Office Action of Taiwan Counterpart Application", issued on Nov. 10, 2016, p. 1-p. 5.

* cited by examiner

Primary Examiner — Richard Elms
Assistant Examiner — Mohammed A Bashar
(74) Attorney, Agent, or Firm — J.C. Patents

(57) ABSTRACT

A memory device including multiple word lines, multiple bit lines and a memory cell array is provided. The word lines intersect the bit lines, and an included angle between the word lines and the bit lines is not a right angle. The memory cell array includes multiple memory cells respectively disposed at the intersections of the word lines and the bit lines. Each row of the memory cells is electrically connected to one of the word lines, and each column of the memory cells is electrically connected to one of the bit lines.

18 Claims, 4 Drawing Sheets

NAND FLASH MEMORY DEVICE WITH OBLIQUE ARCHITECTURE AND MEMORY CELL ARRAY

BACKGROUND OF THE INVENTION

Field of the Invention

The invention relates to a memory device, and particularly relates to a NAND flash memory device.

Description of Related Art

Along with a continuous increase of the number of transistors used in a NAND flash memory, the size of the transistors becomes smaller, and lines for connecting the transistors become denser. As a gap between word lines is reduced, a space between floating gates of unit cells is also compressed, such that the adjacent cells may interfere with each other to cause a drift of a threshold voltage (Vth), and such interference results in a fact that a distribution width of the threshold voltage is increased.

When a line width of the memory is reduced to be smaller than 2× nanometers (nm), a bit line direct interference becomes more important, especially the interference from the floating gate to an adjacent channel on a bit line direction may cause a reduction of a read window. Therefore, the excessively close threshold voltage distribution is one of the greatest challenges in current manufacturing of multi-level cells (MLC) such as triple-level cells (TLC).

For example, FIG. 1 is a layout schematic diagram of bit lines and word lines of a conventional NAND flash memory. Referring to FIG. 1, the bit lines and the word lines of the conventional NAND flash memory are configured in an orthogonal manner, for example, bit lines BL1 and BL2 are respectively orthogonal to a word line WL1. Memory cells 12 and 14 are respectively disposed at an intersection of the bit line BL1 and the word line WL1 and an intersection of the bit line BL2 and the word line WL1, and are electrically connected to the bit lines BL1 and BL2 and the word line WL1, where a parasitic coupling capacitance C1 is formed between the memory cells 12 and 14.

In detail, FIG. 2 is a layout cross-sectional view of a region 10 of FIG. 1, in which a control gate layer CG1 of the word line WL1, floating gates FG1 and FG2 corresponding to the memory cells 12 and 14, the bit lines BL1 and BL2, and an insulating layer IL1 are illustrated. Since the floating gates FG1 and FG2 are close to each other, a parasitic bit line coupling capacitance C1 is formed therebetween, and the bit line coupling capacitance C1 is a main reason that causes the bit line direct interference.

SUMMARY OF THE INVENTION

The invention is directed to a memory device, in which a coupling capacitance between adjacent memory cells is decreased through oblique configuration of word lines and bit lines, so as to avoid mutual interference of the adjacent memory cells.

The invention provides a memory device including a plurality of word lines, a plurality of bit lines and a memory cell array. The bit lines respectively intersect the word lines, and an included angle between the bit lines and the word lines is not a right angle. The memory cell array includes a plurality of memory cells respectively disposed at intersections of the word lines and the bit lines, where each row of the memory cells is electrically connected to one of the word lines, and each column of the memory cells is electrically connected to one of the bit lines.

In an embodiment of the invention, an overlapping width of floating gate regions of two adjacent memory cells among the memory cells on a bit line direction is smaller than a width of the floating gate region on the bit line direction.

In an embodiment of the invention, each of the memory cells in the memory cell array includes a transistor having a floating gate, a first terminal and a second terminal. The floating gates of the transistors of each row of the memory cells are electrically connected to one of the word lines, and the first terminals and the second terminals of the transistors of each column of the memory cells are electrically connected to one of the bit lines.

In an embodiment of the invention, the memory device further includes a column decoder and a row decoder. The column decoder is electrically connected to the bit lines to drive the bit lines, and the row decoder is electrically connected to the word lines to drive the word lines.

In an embodiment of the invention, one of the column decoder and the row decoder is configured in parallel with the word lines or the bit lines, and the column decoder and the row decoder have a perpendicular configuration therebetween.

In an embodiment of the invention, the column decoder and the row decoder are respectively configured in parallel with the word lines and the bit lines, and the column decoder and the row decoder have the included angle therebetween.

In an embodiment of the invention, the word lines or the bit lines are configured in a zigzag manner, and a plurality of turning points of the word lines or the bit lines has a turning angle.

In an embodiment of the invention, the turning points are located at the intersections of the word lines and the bit lines.

In an embodiment of the invention, a value of the turning angle is between 30 degrees and 150 degrees.

In an embodiment of the invention, a value of the included angle between the bit lines and the word lines is between 15 degrees and 75 degrees.

In an embodiment of the invention, the memory cell includes a single-level cell (SLC), a multi-level cell (MLC), a triple-level cell (TLC) or a quadruple-level cell (QLC).

The invention provides a memory device including a plurality of word lines and a plurality of bit lines. The plurality of word lines are parallel to each other in a first direction, and the plurality of bit lines parallel to each other in a second direction. The plurality of word lines are across the plurality of bit lines, and an angle defined by the first direction and the second direction is not equal to 90 degrees.

According to the above descriptions, in the memory device of the invention, by obliquely configuring the word lines and the bit lines, the floating gate regions of the adjacent memory cells are staggered along the bit line direction without right aligning to each other, such that the overlapping width between the floating gate regions of the adjacent memory cells is decreased to reduce the coupling capacitance formed therebetween, so as to avoid or mitigate a bit line to bit line interference.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In a NAND flash memory of the invention, an original perpendicular configuration between word lines and bit lines is changed to an oblique configuration, such that floating gate regions of two adjacent memory cells are staggered along a bit line direction. In this way, an overlapping width between the floating gate regions of the adjacent memory cells is decreased to reduce a coupling capacitance formed therebetween, so as to mitigate a bit line to bit line interference.

Figure 3:
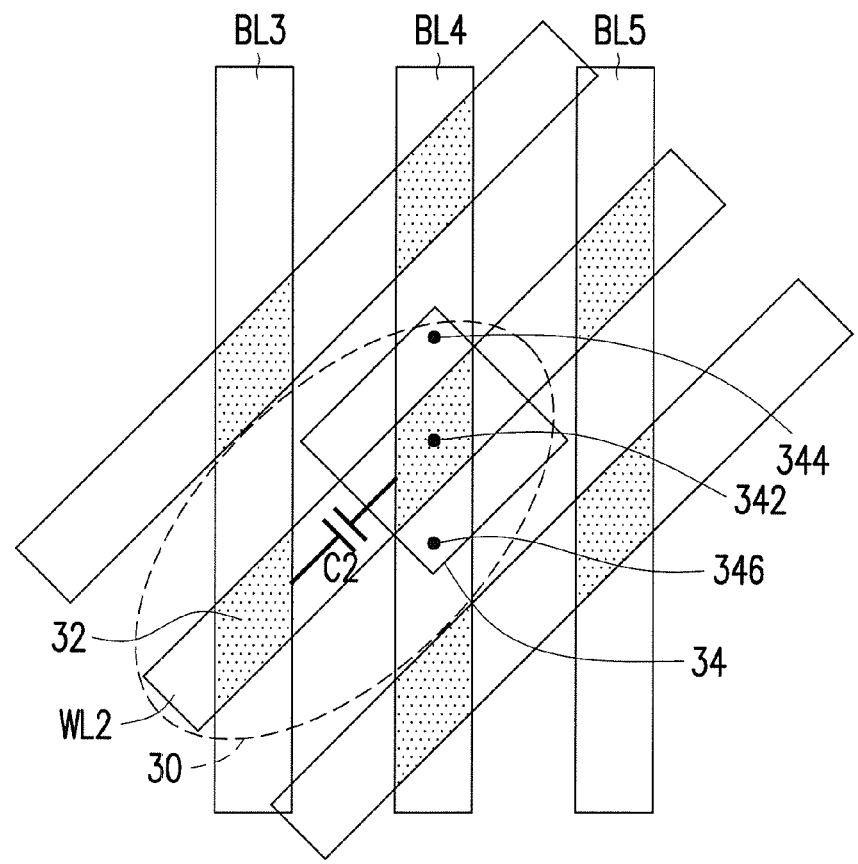
FIG. 3 is a layout schematic diagram of a memory device according to an embodiment of the invention.

FIG. 3 is a layout schematic diagram of a memory device according to an embodiment of the invention. The memory device of the present embodiment includes a plurality of word lines parallel to each other (for example, a word line WL2 in FIG. 3) in a first direction, a plurality of bit lines parallel to each other (for example, bit lines BL3, BL4, BL5 in FIG. 3) in a second direction, where the bit lines respectively intersect the word lines, and an included angle between bit lines and the word lines is not a right angle. That is to say the angle defined by the first direction and the second direction is not equal to 90 degrees. In one embodiment, the memory device further includes a memory cell array, and the memory cell array includes a plurality of memory cells respectively disposed at intersections of the word lines and the bit lines (for example, a memory cell 32 disposed at an intersection of the word line WL2 and the bit line BL3, and a memory cell 34 disposed at an intersection of the word line WL2 and the bit line BL4). Each row of the memory cells is electrically connected to one of the word lines, and each column of the memory cells is electrically connected to one of the bit lines. The memory cells include single-level cells (SLC), multi-level cells (MLC), triple-level cells (TLC) or quadruple-level cells (QLC), though the invention is not limited thereto.

It should be noted that each of the memory cells includes a transistor, and the transistor, for example, has a gate, a source and a drain. The gates of the transistors of each row of the memory cells are electrically connected to one of the word lines, and the sources and the drains of the transistors of each column of the memory cells are electrically connected to one of the bit lines.

For example, the memory cells 32 and 34 of FIG. 3 are located on a same row, and are electrically connected to the word line WL2. Moreover, regarding the memory cell 34, a floating gate 342 thereof is located under a control gate (not shown) of the word line WL2, and a source 344 and a drain 346 of the memory cell 34 cross over two sides of the word line WL2, and are electrically connected to a drain and a source of adjacent memory cells located on the same bit line BL4, respectively. Moreover, a parasitic bit line coupling capacitance C2 is formed between the floating gates of the adjacent memory cells 32 and 34.

It should be noted that if the aforementioned included angle (taking an acute angle included between the word lines and the bit lines as an example) is smaller than 15 degrees, an overlapping width of the floating gate regions of the adjacent memory cells is still large, such that an amelioration effect is not obvious; and if the included angle is larger than 75 degrees, the memory cell array has an excessive length along a word line direction or the bit line direction, and occupies a larger chip space, such that the chip size is sacrificed. Therefore, a value of the aforementioned included angle is preferably between 15 degrees and 75 degrees, though the invention is not limited thereto.

Figure 1:
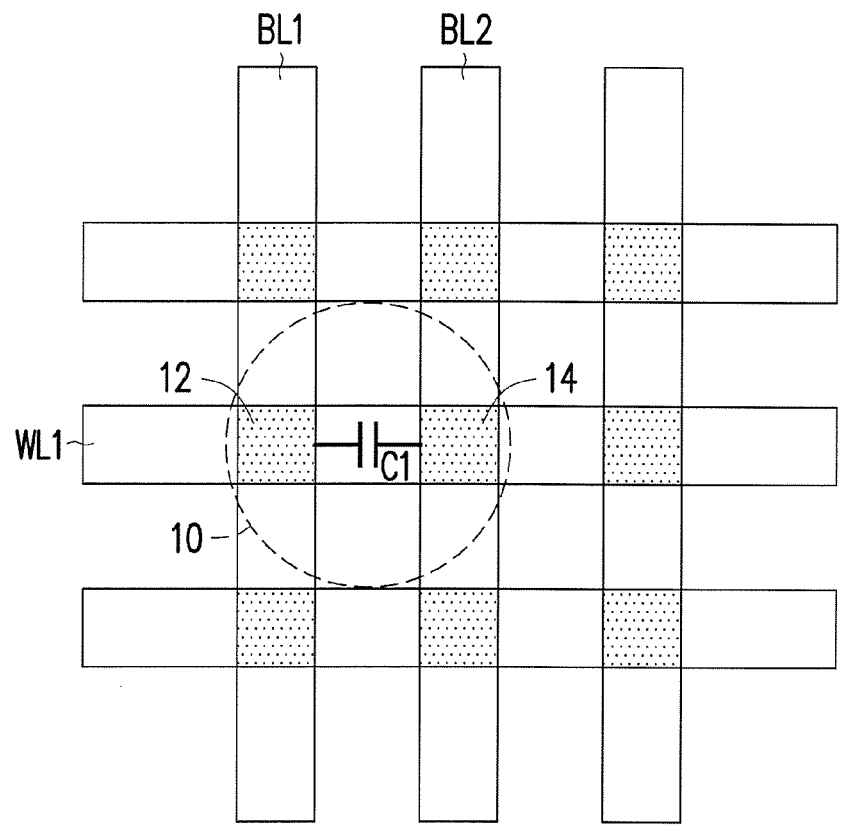
FIG. 1 is a layout schematic diagram of bit lines and word lines of a conventional NAND flash memory.
Figure 2:
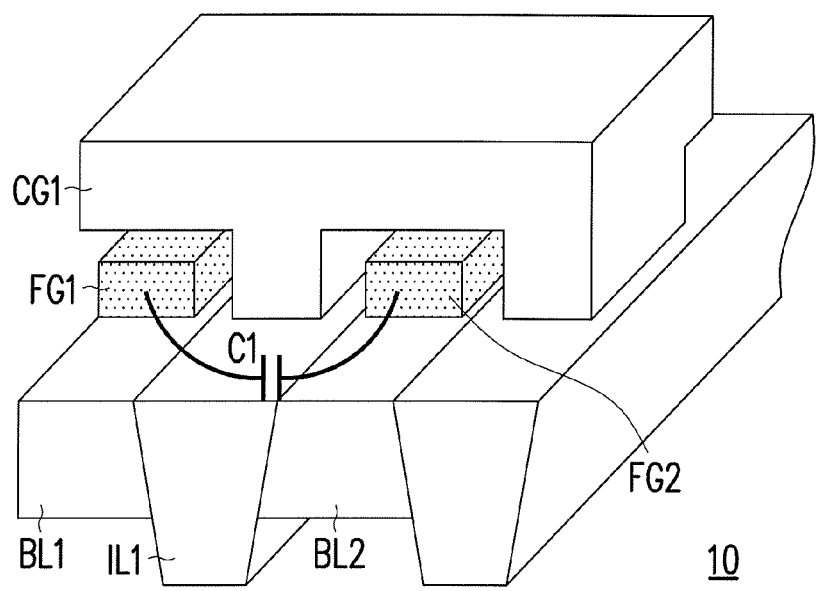
FIG. 2 is a layout cross-sectional view of a region 10 of FIG. 1.
Figure 4:
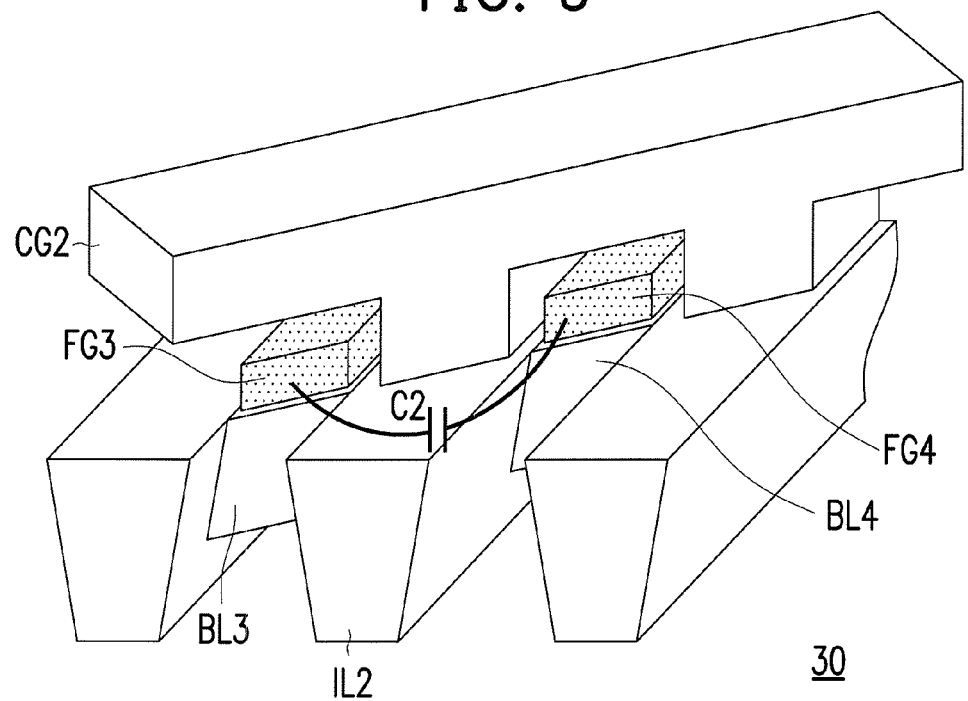
FIG. 4 is a layout cross-sectional view of a region 30 in FIG. 3.

FIG. 4 is a layout cross-sectional view of a region 30 in FIG. 3, in which a control gate layer CG2 of the word line WL2, floating gates FG3 and FG4 corresponding to the memory cells 32 and 34, the bit lines BL3 and BL4 and an insulating layer IL2 are respectively illustrated. The parasitic bit line coupling capacitance C2 is formed between the floating gates FG3 and FG4. Since the control gate layer CG2 and the bit lines BL3 and BL4 have an included angle (which is not a right angle) therebetween, a distance between the floating gates FG3 and FG4 is prolonged, such that an overlapping width of regions covered by the floating gates FG3 and FG4 on the word line direction (which is the same as a direction of the control gate layer CG2), and the overlapping width is smaller than a width of the regions covered by the floating gates FG3 and FG4 on the bit line direction. In brief, if the conventional memory architecture in which the bit lines and the word lines are perpendicular to each other is adopted, an overlapping width of the floating gate regions of the adjacent memory cells is equal to a width of the individual floating gate regions, and if the architecture of the memory device of the invention is adopted, the overlapping width of the floating gate regions is decreased, such that the parasitic bit line coupling capacitance C2 is smaller than the capacitance generated by the conventional memory architecture (for example, the capacitance C1 shown in FIG. 2), so as to achieve the effect of mitigating the bit line to bit line interference.

It should be noted that besides the memory cell array, the memory device further includes decoders for driving the bit lines and the word lines, and the decoders are respectively disposed at two sides of the memory cell array, and are electrically connected to all of the bit lines and the word lines, so as to drive the bit lines and the word lines to program the transistors of the memory cells connected to the bit lines and the word lines for storing data. Since the invention adopts the architecture that the bit lines and the word lines are arranged in an oblique configuration, configuration of a column decoder and a row decoder is also varied, which is described in detail below.

Figure 5:
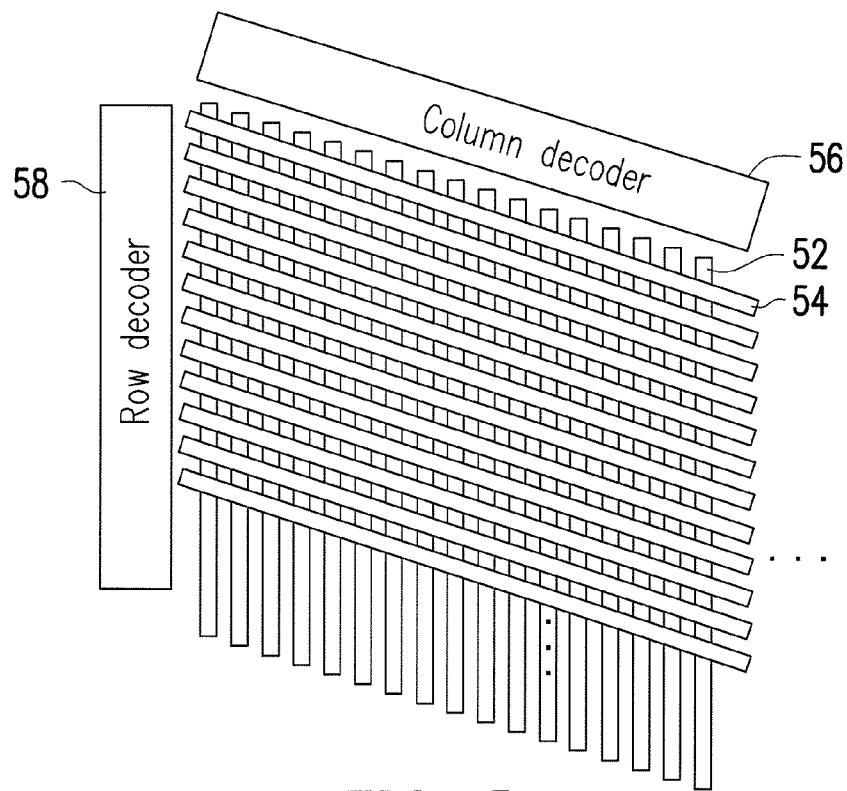
FIG. 5 is a layout schematic diagram of a memory device according to an embodiment of the invention.

In an embodiment of the invention, the column decoder and the row decoder are respectively configured in parallel with the word lines and the bit lines, and the column decoder and the row decoder have an included angle therebetween, where the included angle is the same to the included angle between the word lines and the bit lines. For example, FIG. 5 is a layout schematic diagram of a memory device according to an embodiment of the invention. The memory device of the present embodiment includes a plurality of bit lines 52 and a plurality of word lines 54. The bit lines 52 respectively intersect the word lines 54, and an included angle between the bit lines 52 and the word lines 54 is not a right angle. The memory cells of the memory cell array of the memory device are respectively disposed at intersections of the bit lines 52 and the word lines 54. It should be noted that in the present embodiment, the column decoder 56 is disposed in parallel with the word lines 54, and the row decoder 58 is disposed in parallel with the bit lines 52, and the column decoder 56 and the row decoder 58 have an included angle therebetween, and the included angel is equal to the included angle between the bit lines 52 and the word lines 54. According to such design, the column decoder 56, the row decoder 58 and the bit lines 52 and the word lines 54 are closely configured, and a bit line (BL) capacitance can be kept between different bit lines 52.

Figure 6:
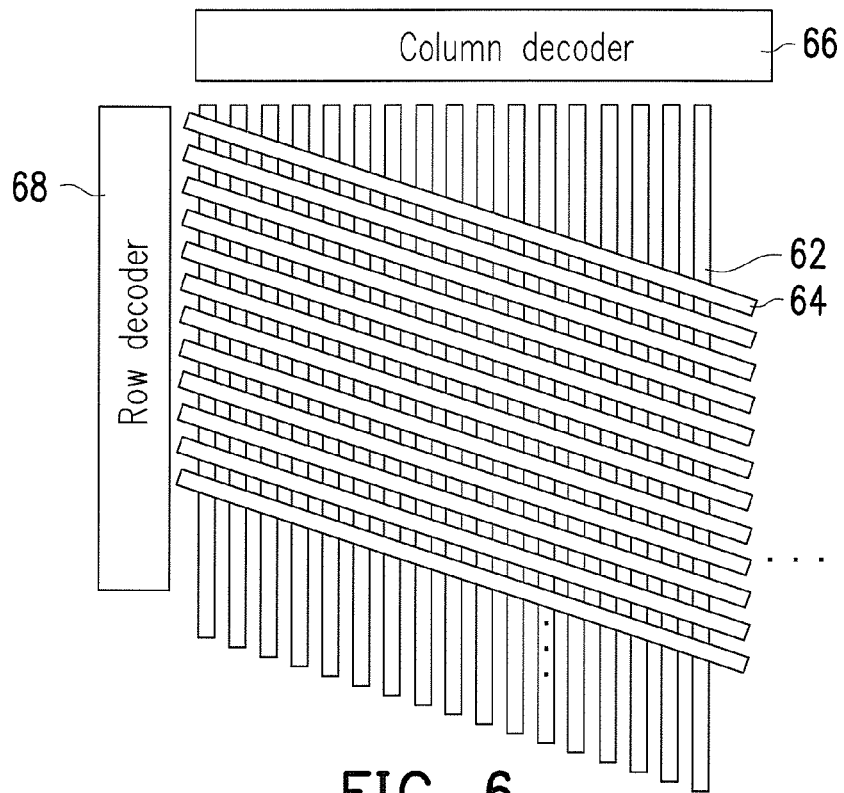
FIG. 6 is a layout schematic diagram of a memory device according to an embodiment of the invention.

In an embodiment, one of the column decoder and the row decoder is disposed in parallel with the word lines or the bit lines, and the column decoder and the row decoder are perpendicular to each other. For example, FIG. 6 is a layout schematic diagram of a memory device according to an embodiment of the invention. The memory device of the present embodiment includes a plurality of bit lines 62 and a plurality of word lines 64. The bit lines 62 respectively intersect the word lines 64, and an included angle between the bit lines 62 and the word lines 64 is not a right angle. The memory cells of the memory cell array of the memory device are respectively disposed at intersections of the bit lines 62 and the word lines 64. It should be noted that in the present embodiment, only the row decoder 68 is disposed in parallel with the bit lines 62, and the column decoder 66 is perpendicular to the row decoder 68, and is not parallel with the word lines 65. According to such design, configuration of the column decoder 66 and the row decoder 68 can be simplified, though a configuration space between the memory cell array and the column decoder 66 is sacrificed.

Figure 7:
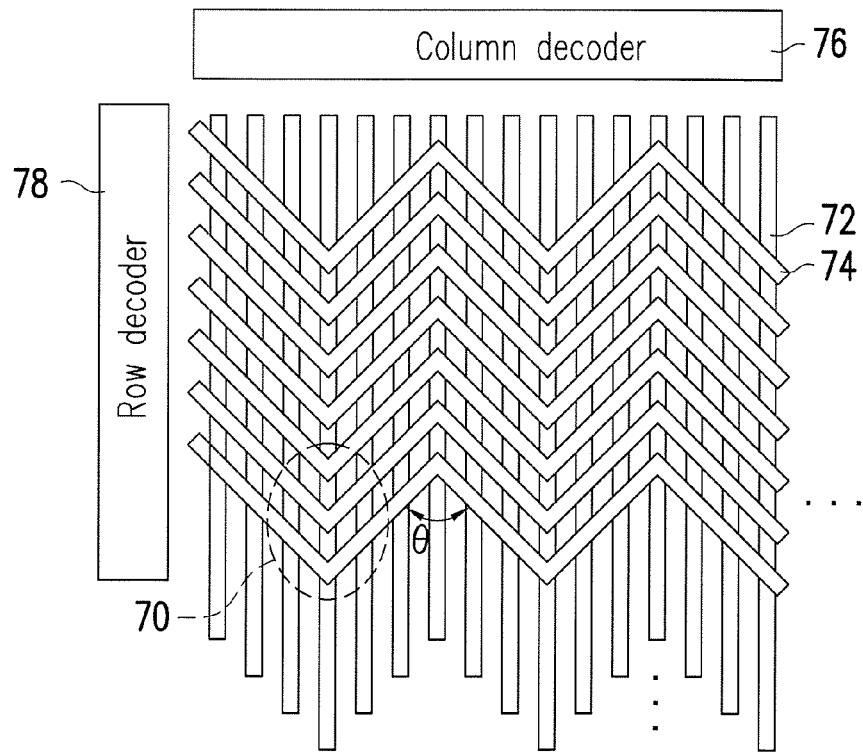
FIG. 7 is a layout schematic diagram of a memory device according to an embodiment of the invention.

In an embodiment, the word lines or the bit lines of the memory device are configured in a zigzag manner, and a plurality of turning points of the word lines or the bit lines has a turning angle. For example, FIG. 7 is a layout schematic diagram of a memory device according to an embodiment of the invention. The memory device of the present embodiment includes a plurality of bit lines 72 and a plurality of word lines 74. The bit lines 72 respectively intersect the word lines 74, and an included angle between the bit lines 72 and the word lines 74 is not a right angle. Particularly, the word lines 74 of the present embodiment are configured in the zigzag manner, and a plurality of turning points of the word lines 74 has a turning angle θ. A value of the turning angle θ is, for example, 30 degrees to 150 degrees, though the invention is not limited thereto.

It should be noted that in order to minimize the overlapping width of floating gate regions between the adjacent memory cells, when the word lines or the bit lines of the memory device adopt the aforementioned zigzag configuration manner, it is preferably to configure the turning points of the word lines or the bit lines at the intersections of the word lines and the bit lines, such that the overlapping width between the floating gate region of the memory cell located at the turning point and the floating gate region of the adjacent memory cell can also be decreased, so as to achieve the effect of mitigating the bit line to bit line interference.

Figure 8:
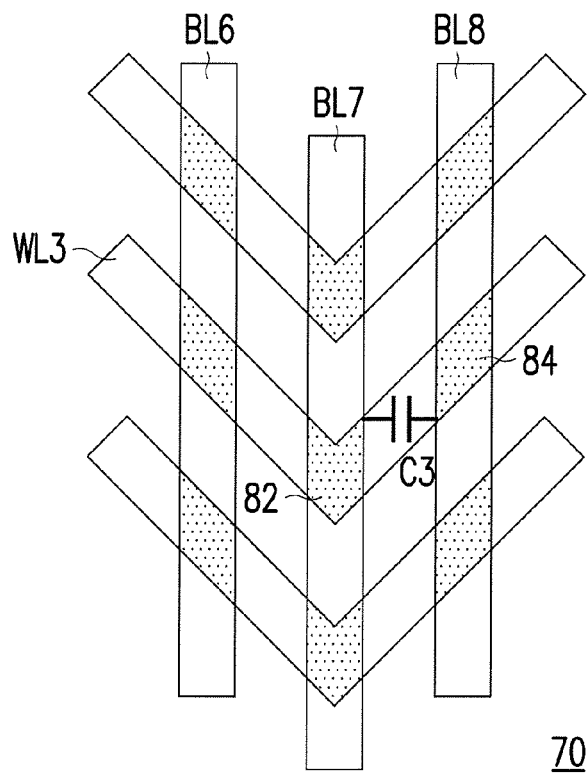
FIG. 8 is an enlarged view of a region 70 in FIG. 7.

For example, FIG. 8 is an enlarged view of a region 70 in FIG. 7. Referring to FIG. 8, the region 70 includes a plurality of bit lines and word lines, for example, bit lines BL6, BL7, BL8 and a word line WL3. The word line WL3 adopts the zigzag configuration manner, and a turning point thereof is located at the intersection of the word line WL3 and the bit line BL7. In this way, the overlapping width between the floating gate regions of the memory cell 82 located at the turning point and the adjacent memory cell 84 can also be decreased, and a coupling capacitance C3 formed therebetween is also decreased, so as to achieve the effect of mitigating the bit line to bit line interference.

In summary, in the memory device of the invention, by obliquely configuring the word lines and the bit lines, the floating gate regions of the adjacent memory cells are staggered along the bit line direction without right aligning to each other, such that the overlapping width between the floating gate regions of the adjacent memory cells is decreased to decrease the coupling capacitance formed therebetween, so as to avoid or mitigate the bit line to bit line interference. Moreover, based on the oblique configuration of the bit lines and the word lines, configuration of the column decoder and the row decoder is changed to configure the bit lines and the word lines in the zigzag manner, where the turning points thereof are configured at the intersections of the bit lines and the word lines. Therefore, diversified configurations are provided for different demands, which may all achieve the effect of mitigating the bit line to bit line interference.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A memory device, comprising:
a plurality of word lines;
a plurality of bit lines, respectively intersecting the word lines, wherein an included angle between the bit lines and the word lines is not a right angle; and
a memory cell array, comprising a plurality of memory cells respectively disposed at intersections of the word lines and the bit lines, wherein each row of the memory cells is electrically connected to one of the word lines, and each column of the memory cells is electrically connected to a same bit line of the bit lines,
wherein each of the memory cells comprises a first terminal and a second terminal, and the first terminal and the second terminal are electrically connected to a same bit line of the bit lines.
2. The memory device as claimed in claim 1, wherein an overlapping width of floating gate regions of two adjacent memory cells among the memory cells on a bit line direction is smaller than a width of the floating gate region on the bit line direction.
3. The memory device as claimed in claim 1, wherein each of the memory cells in the memory cell array comprises:
a transistor, having a floating gate, the first terminal and the second terminal,
wherein the floating gates of the transistors of each row of the memory cells are electrically connected to one of the word lines.
4. The memory device as claimed in claim 1, further comprising:
a column decoder, electrically connected to the bit lines to drive the bit lines; and
a row decoder, electrically connected to the word lines to drive the word lines.
5. The memory device as claimed in claim 4, wherein one of the column decoder and the row decoder is configured in parallel with the word lines or the bit lines, and the column decoder and the row decoder have a perpendicular configuration therebetween.

6. The memory device as claimed in claim 4, wherein the column decoder and the row decoder are respectively configured in parallel with the word lines and the bit lines, and the column decoder and the row decoder have the included angle therebetween.

7. The memory device as claimed in claim 1, wherein the word lines or the bit lines are configured in a zigzag manner, and a plurality of turning points of the word lines or the bit lines has a turning angle.

8. The memory device as claimed in claim 7, wherein the turning points are located at the intersections of the word lines and the bit lines.

9. The memory device as claimed in claim 8, wherein a value of the turning angle is between 30 degrees and 150 degrees.

10. The memory device as claimed in claim 1, wherein a value of the included angle is between 15 degrees and 75 degrees.

11. A memory device, comprising:
a plurality of word lines parallel to each other in a first direction;
a plurality of bit lines parallel to each other in a second direction, wherein the plurality of word lines are across the plurality of bit lines, and an included angle defined by the first direction and the second direction is not equal to 90 degrees; and
a memory cell array, comprising a plurality of memory cells respectively disposed at intersections of the word lines and the bit lines,
wherein each of the memory cells comprises a first terminal and a second terminal, and the first terminal and the second terminal are electrically connected to a same bit line of the bit lines.

12. The memory device as claimed in claim 11, further comprising:
a column decoder, electrically connected to the bit lines to drive the bit lines; and
a row decoder, electrically connected to the word lines to drive the word lines.

13. The memory device as claimed in claim 12, wherein one of the column decoder and the row decoder is configured in parallel with the word lines or the bit lines, and the column decoder and the row decoder have a perpendicular configuration therebetween.

14. The memory device as claimed in claim 12, wherein the column decoder and the row decoder are respectively configured in parallel with the word lines and the bit lines, and the column decoder and the row decoder have the included angle therebetween.

15. The memory device as claimed in claim 11, wherein the word lines or the bit lines are configured in a zigzag manner, and a plurality of turning points of the word lines or the bit lines has a turning angle.

16. The memory device as claimed in claim 15, wherein the turning points are located at the intersections of the word lines and the bit lines.

17. The memory device as claimed in claim 15, wherein a value of the turning angle is between 30 degrees and 150 degrees.

18. The memory device as claimed in claim 11, wherein a value of the included angle is between 15 degrees and 75 degrees.

* * * * *